US007265425B2

(12) United States Patent
Chen et al.

(10) Patent No.: US 7,265,425 B2
(45) Date of Patent: Sep. 4, 2007

(54) SEMICONDUCTOR DEVICE EMPLOYING AN EXTENSION SPACER AND A METHOD OF FORMING THE SAME

(75) Inventors: Kuang-Hsin Chen, Jung-Li (TW); Tang-Xuan Zhong, Kaohsiung (TW); Chien-Chao Huang, Hsin-Chu (TW); Cheng-Kuo Wen, HsinChu (TW); Di-Hong Lee, Austin, TX (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/989,073

(22) Filed: Nov. 15, 2004

(65) Prior Publication Data

US 2006/0102955 A1 May 18, 2006

(51) Int. Cl.
 *H01L 29/94* (2006.01)
(52) U.S. Cl. .............. 257/382; 257/384; 257/E29.266
(58) Field of Classification Search ............ 257/900, 257/336, 344, 382, 383, 384, 408, 412, 377, 257/E29.152, E29.266, E29.269, E29.278; 438/304, 303, 200, 184, 230, 265, 595
 See application file for complete search history.

(56) References Cited

U.S. PATENT DOCUMENTS 6,274,446 B1 * 8/2001 Agnello et al. ............ 438/304
6,642,119 B1 * 11/2003 Pelella et al. ............. 438/303
6,753,574 B2 * 6/2004 Yamaguchi et al. ......... 257/331
6,812,073 B2 * 11/2004 Bu et al. .................. 438/151
2002/0081794 A1 * 6/2002 Ito ............................ 438/200
2002/0130378 A1 * 9/2002 Forbes et al. ............. 257/412
2005/0116360 A1 * 6/2005 Huang et al. ............. 257/900

OTHER PUBLICATIONS

Shimizu, A., et al., "Local Mechanical Stress Control (LMC): A New Technique for CMOS-Performance Enhancement," IEDM, 2001, pp. 433-436, IEEE, Los Alamitos, CA.

* cited by examiner

*Primary Examiner*—Minhloan Tran
*Assistant Examiner*—Benjamin Tzu-Hung Liu
(74) *Attorney, Agent, or Firm*—Slater & Matsil, L.L.P.

(57) ABSTRACT

A semiconductor device formed on a semiconductor substrate and a method of forming the same. In one embodiment, the semiconductor device includes a gate over the semiconductor substrate and a dielectric liner on a sidewall of the gate. The semiconductor device also includes an extension spacer adjacent and extending laterally beyond the dielectric liner along the semiconductor substrate. The semiconductor device further includes a source/drain located below an upper surface of the semiconductor substrate and adjacent a channel region under the gate. The source/drain extends under the dielectric liner and the extension spacer. The semiconductor device still further includes a silicide region over a portion of the source/drain and extending laterally beyond the extension spacer along the semiconductor substrate. Thus, the extension spacer is interposed between the dielectric liner and the silicide region located over a portion of the source/drain.

33 Claims, 7 Drawing Sheets

SEMICONDUCTOR DEVICE EMPLOYING AN EXTENSION SPACER AND A METHOD OF FORMING THE SAME

TECHNICAL FIELD

The present invention is directed, in general, to semiconductor devices and, more specifically, to a semiconductor device employing an extension spacer and a method of forming the same.

BACKGROUND

A reduction of the size and the inherent features of semiconductor devices (e.g., a metal-oxide semiconductor field-effect transistor) has enabled continued improvement in speed, performance, density, and cost per unit function of integrated circuits over the past few decades. In accordance with a design of the transistor and one of the inherent characteristics thereof, modulating a length of a channel region underlying a gate between a source and drain of the transistor alters a resistance associated with the channel region, thereby affecting a performance of the transistor. More specifically, shortening the length of the channel region reduces a source-to-drain resistance of the transistor, which, assuming other parameters are maintained relatively constant, may allow an increase in current flow between the source and drain when a sufficient voltage is applied to the gate of the transistor.

In an environment of a transistor with a recessed source and drain (i.e., the regions of the source and drain are located below an upper surface of a substrate forming the foundation therefor), spacers about the gate may aid in a definition of the length of the channel region. More particularly, a source/drain region of the source and drain is often formed by an ion implantation process employing the gate and spacers thereabout as a mask to define the respective source/drain regions. Thus, a width of the spacers about the gate directly impacts a dimension and location of the source/drain regions of the source and drain. The thinner or slimmer the spacers, the closer the source/drain regions of the source and drain are formed about the channel region. As a result, the length of the channel region is reduced and the source-to-drain resistance is also reduced, thereby potentially augmenting a performance of the transistor.

To further enhance transistor performance, strain may be introduced in the channel region of the transistor to improve carrier mobility. Generally, it is desirable to induce a tensile strain in the channel region of a N-type metal oxide semiconductor ("NMOS") device in a source-to-drain direction, and to induce a compressive strain in the channel region of a P-type metal oxide semiconductor ("PMOS") device in a source-to-drain direction.

A typical technique of creating the strain includes depositing a high stress film over a transistor formed over and within a substrate after the transistor is constructed. The high stress film or stressor exerts significant influence on the channel region, modifying a silicon lattice spacing in the channel region, and thus introducing strain therein. In this case, the stressor is deposited over the transistor. This approach is described in detail by A. Shimizu, et al., in a publication entitled "Local Mechanical Stress Control (LMC): A New Technique for CMOS Performance Enhancement," pp. 433-436, published in the Digest of Technical Papers of the 2001 International Electron Device Meeting, which is incorporated herein by reference.

In accordance with the design features of the transistor, employing slim spacers about the gate of the transistor may augment a strain within the channel region thereof. As mentioned above, a prevalent method of introducing the strain is to deposit a high stress film over the transistor. Thus, if the spacers about the gate are thin, the high stress film (for instance, a contact etching stop layer) is deposited in closer proximity to the channel region. Consequently, the high stress film can exert a higher level of strain within the channel region thereby augmenting a strain effect within the channel region of the transistor.

While the advantages of incorporating slim spacers into transistors (or any semiconductor device) appear decisive, there are limitations associated with slim spacers about the gate of the transistor. One of the more prevalent limitations is that slim spacers about the gate necessarily allow a silicide region formed over the source and drain of the transistor to be in closer proximity to the channel region of the transistor. If the silicide region diffuses through a lightly doped drain (which is typically adjacent the channel region) of the source or the drain, an electrical path may be created through the source or drain via the silicide region to the channel region. As a result, the silicide region may create a short circuit with the channel region thereby potentially providing a silicide spike within the transistor.

Accordingly, what is needed in the art is a semiconductor device that may incorporate slim spacers about the gate thereof to take advantage of the benefits associated with a channel region having a reduced length while at the same time overcoming the deficiencies of the prior art.

SUMMARY OF THE INVENTION

These and other problems are generally solved or circumvented, and technical advantages are generally achieved, by advantageous embodiments of the present invention, which includes a semiconductor device formed on a semiconductor substrate. In one embodiment, the semiconductor device includes a gate over the semiconductor substrate and a dielectric liner on a sidewall of the gate. The semiconductor device also includes an extension spacer adjacent and extending laterally beyond the dielectric liner along the semiconductor substrate. The semiconductor device further includes a source/drain located below an upper surface of the semiconductor substrate and adjacent a channel region under the gate. The source/drain extends under the dielectric liner and the extension spacer. The semiconductor device still further includes a silicide region over a portion of the source/drain and extending laterally beyond the extension spacer along the semiconductor substrate. Thus, the extension spacer is interposed between the dielectric liner and the silicide region located over a portion of the source/drain.

In another aspect, the present invention provides a method of forming a semiconductor device on a semiconductor substrate including, in one embodiment, forming a gate over the semiconductor substrate and a dielectric liner on a sidewall of the gate. The method also includes forming an extension spacer adjacent and extending laterally beyond the dielectric liner along the semiconductor substrate. The method further includes forming a source/drain located below an upper surface of the semiconductor substrate and adjacent a channel region under the gate. The source/drain extends under the dielectric liner and the extension spacer. The method still further includes forming a silicide region over a portion of the source/drain and extending laterally beyond the extension spacer along the semiconductor substrate.

In yet another aspect, the semiconductor device is embodied in a transistor formed on a semiconductor substrate. In one embodiment, the transistor includes a gate over the semiconductor substrate, and first and second dielectric liners on opposing sidewalls of the gate. The transistor also includes first and second extension spacers adjacent and extending laterally beyond the first and second dielectric liners, respectively, along the semiconductor substrate. The transistor further includes a source located below an upper surface of the semiconductor substrate and adjacent a channel region under the gate. The source extends under the first dielectric liner and the first extension spacer. The transistor still further includes a drain located below an upper surface of the semiconductor substrate and adjacent a channel region under the gate. The drain extends under the second dielectric liner and the second extension spacer. The transistor still further includes first and second silicide regions over a portion of the source and drain, respectively, and extending laterally beyond the first and second extension spacers, respectively, along the semiconductor substrate. Thus, the first extension spacer is interposed between the first dielectric liner and the first silicide region located over a portion of the source. The second extension spacer is interposed between the second dielectric liner and the second silicide region located over a portion of the drain.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
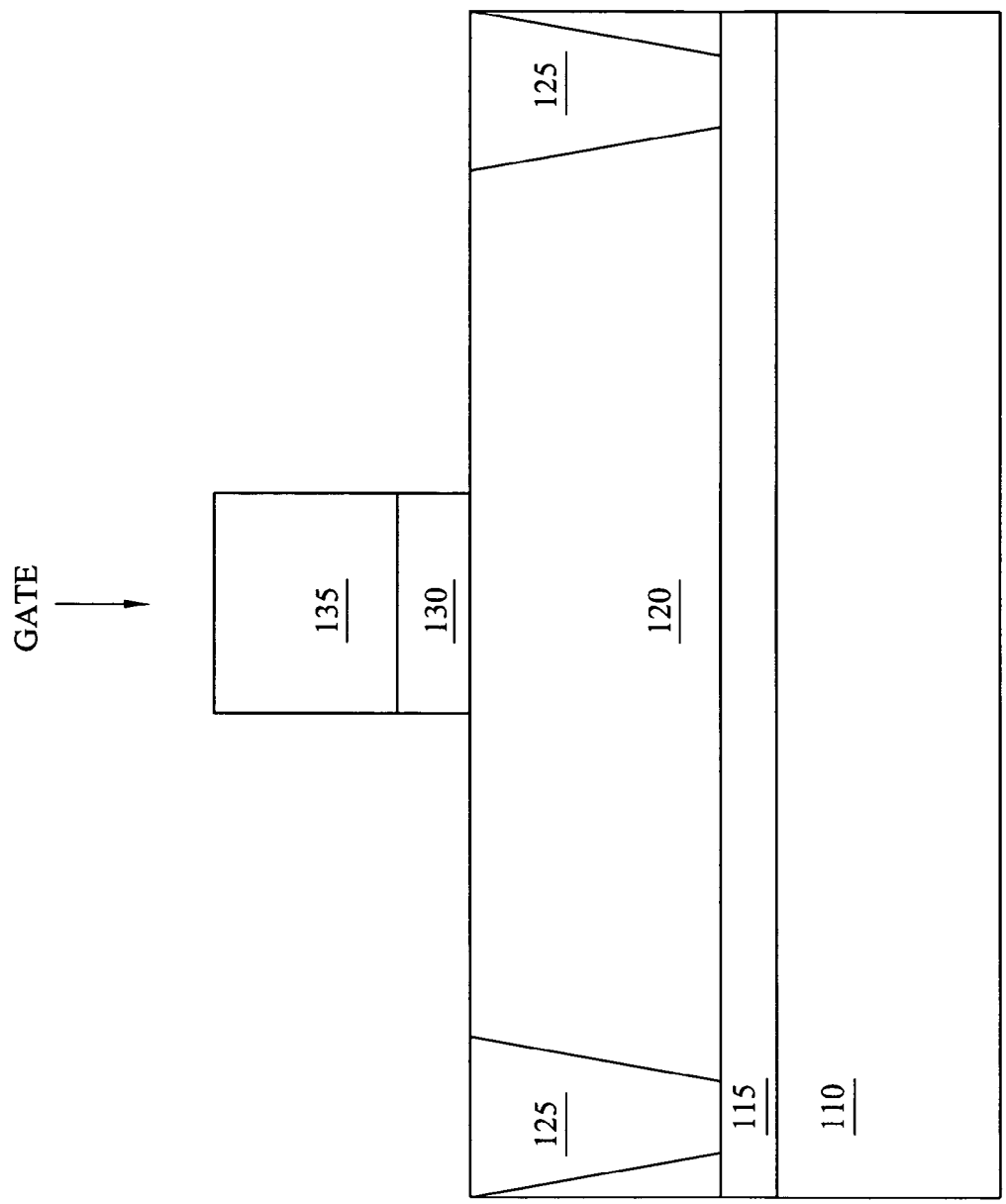
FIGS. 1 to 7 illustrate cross sectional views of an embodiment of constructing a semiconductor device according to the principles of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a transistor and a related method of forming the same. The principles of the present invention, however, may also be applied to other semiconductor devices of like construction and integrated circuits, in general. For example, embodiments of the present invention may be employed to form circuits for NOR gates, logic gates, inverters, XOR gates, NAND gates, P-type metal oxide semiconductor ("PMOS") devices for pull-up transistors, N-type metal oxide semiconductor ("NMOS") devices for pull-down transistors, and the like.

Referring to FIGS. 1 to 7, illustrated are cross sectional views of an embodiment of constructing a semiconductor device (e.g., a transistor) according to the principles of the present invention. At an interim step with reference to FIG. 1, a transistor is partially constructed on a semiconductor substrate (also referred to as a "substrate") such as silicon-on-insulator (or a bulk silicon) substrate including an underlying substrate 110 [e.g., a P-type or N-type silicon substrate with a surface orientation of (100), (110) or (111), of quartz, ceramic or the like], a buried insulating layer 115 (e.g., an "insulator" such as a buried oxide layer of about 3500 angstroms) and an overlying layer of silicon 120 having a thickness of about 1500 angstroms and located over portions of the buried insulating layer 115. The buried insulating layer 115 and overlying layer of silicon 120 are formed over the underlying substrate 110 employing conventional processes. Alternatively, the substrate may be formed from bulk silicon having a surface orientation of (100).

Shallow trench isolation regions 125 are formed over the buried insulating layer 115 extending through the overlying layer of silicon 120 and about the transistor. The shallow trench isolation regions 125 are formed by using a photoresist mask to define the respective regions therein over the buried insulating layer 115. The shallow trench isolation regions 125 are then etched and backfilled with a dielectric such as silicon dioxide, silicon nitride, a combination thereof, or any other suitable dielectric material. Those skilled in the art understand that isolation regions may be formed using other conventional methods such as a local oxidation of silicon process.

A gate of the transistor is constructed with a gate dielectric layer 130 and a gate electrode 135 formed and patterned using techniques well known in the art over the overlying layer of silicon 120. The gate dielectric layer 130 is preferably a high-"k" dielectric material such as silicon oxide, silicon oxynitride, silicon nitride, an oxide, a nitrogen containing oxide, a combination thereof, or the like. Preferably, the gate dielectric layer 130 has a relative permittivity value greater than about four. Other examples of dielectric materials include aluminum oxide, lanthanum oxide, hafnium oxide, zirconium oxide, hafnium oxynitride, or combinations thereof.

In an advantageous embodiment in which the gate dielectric layer 130 includes an oxide layer, the gate dielectric layer 130 may be formed by any oxidation process such as wet or dry thermal oxidation in an ambient environment with an oxide, water, nitric oxide, or a combination thereof, or by chemical vapor deposition techniques using tetraethyl orthosilicate and oxygen as a precursor. In an exemplary embodiment, the gate dielectric layer 130 is about eight angstroms to about 50 angstroms in thickness, but more preferably about 16 angstroms in thickness.

The gate electrode 135 includes a conductive material such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped polycrystalline silicon, other conductive materials, or a combination thereof. In one example, amorphous silicon is deposited and recrystallized to create polycrystalline silicon (also referred to as "polysilicon"). In an advantageous embodiment in which the gate electrode 135 is polysilicon, the gate electrode 135 may be formed by depositing doped or undoped polysilicon by low pressure chemical vapor deposition to a thickness in the range of about 400 angstroms to about 2500 angstroms, but more preferably about 1500 angstroms.

The gate dielectric layer 130 and the gate electrode 135 may be patterned by photolithography techniques as are known in the art. Generally, photolithography involves depositing a photoresist material, which is then masked, exposed, and developed. After the photoresist mask is patterned, an etching process may be performed to remove unwanted portions of the gate dielectric material and the gate electrode material to form the gate dielectric layer 130 and the gate electrode 135. In an embodiment wherein the gate electrode 135 is formed from polysilicon and the gate dielectric layer 130 is an oxide, the etching process may be a wet or dry, anisotropic or isotropic, etch process, but preferably is an anisotropic dry etch process.

A width of the gate electrode 135 is a function of the type of semiconductor device being constructed. For instance, a gate width of the PMOS devices to a gate width of the NMOS devices may be about equal to a ratio of electron mobility to hole mobility in bulk silicon or strained silicon. Alternatively, the ratio of the gate width of the PMOS devices to the gate width of the NMOS devices may be about equal to the square root of the ratio of electron mobility to hole mobility in bulk silicon or strained silicon. In short, the dimensions of the gate and other features of the semiconductor device described herein vary in accordance with the application and the type of semiconductor device being constructed therefor.

Figure 2:
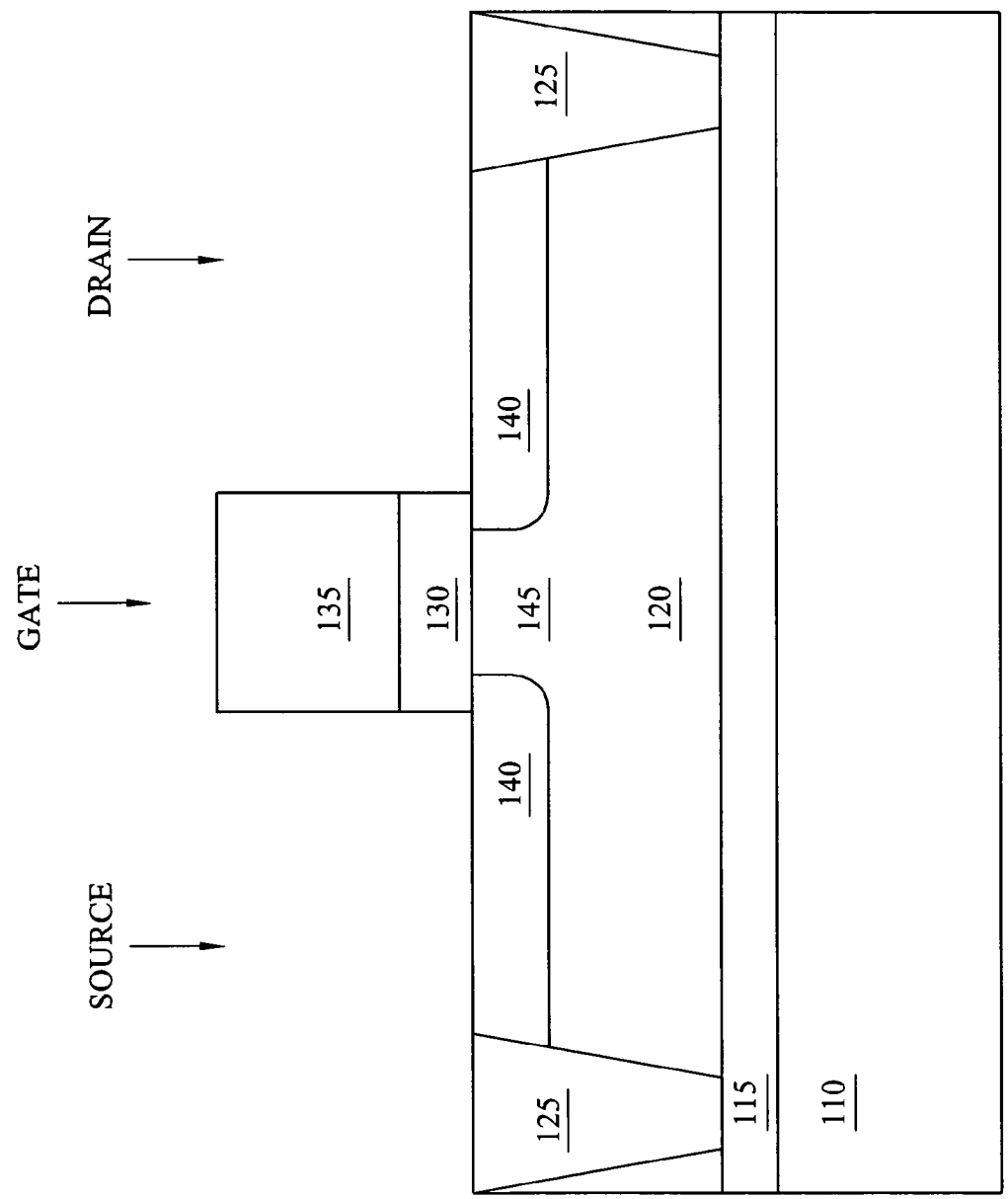

Turning now to FIG. 2, illustrated is a cross sectional view of an embodiment of forming lightly doped drains 140 for a source and drain of the transistor in accordance with the principles of the present invention. For the purposes of clarity, the source or the drain may also be referred to as a "source/drain." The lightly doped drains 140 are located below an upper surface of the silicon-on-insulator substrate and within the overlying layer of silicon 120 thereof, and adjacent a channel region 145 under the gate. The lightly doped drains 140 form shallow junctions within the silicon-on-insulator substrate adjacent the channel region 145 underlying the gate of the transistor.

Typically, to form the lightly doped drains 140 of the transistor, boron ions (or other P-type dopants) for a PMOS device or arsenic ions (or other N-type dopants) for a NMOS device are implanted into the overlying layer of silicon 120 and the gate serves as a mask. The ion implantation process of the P-type dopants or N-type dopants may be performed at an energy level of about 1 to 5 keV and at a dose of $2 \times 10^{14}$ to $3 \times 10^{15}$ atoms/cm$^2$. An exemplary depth of the lightly doped drains 140 is about 100 angstroms. In accordance with the orientation of the transistor as described herein, the lightly doped drains 140 have a surface orientation of (100).

Figure 3:
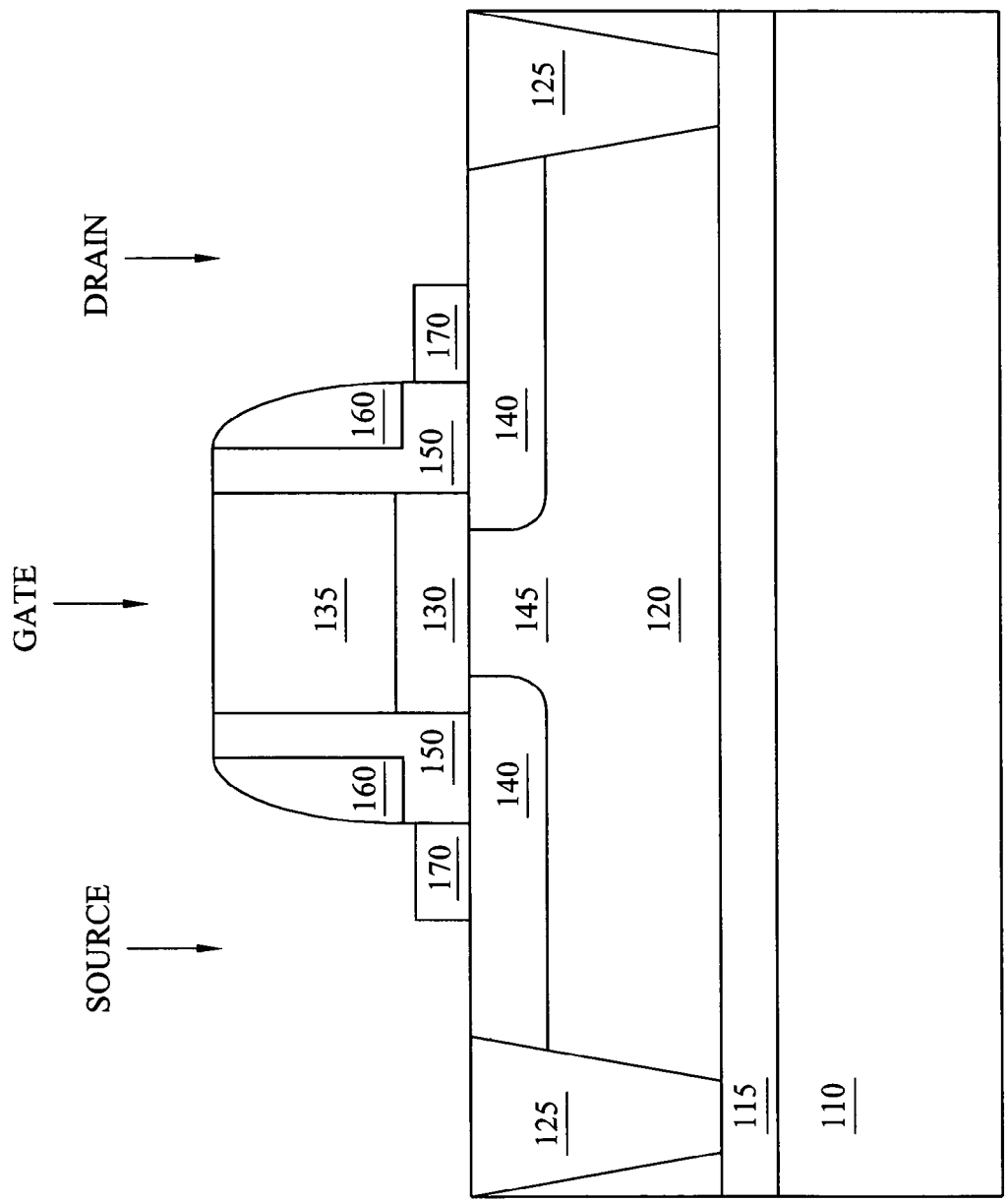

Turning now to FIG. 3, illustrated is a cross sectional view of an embodiment of forming a plurality of spacers of the transistor in accordance with the principles of the present invention. More specifically, the transistor includes dielectric liners 150, spacers 160 and extension spacers 170 about the gate and above an upper surface of the silicon-on-insulator substrate. The dielectric liners 150 (also referred to as "first and second dielectric liners") are formed on side walls (i.e., opposing side walls) of the gate, and the spacers 160 (also referred to as "first and second spacers") are formed on the dielectric liners 150. The dielectric liners 150 and the spacers 160, individually or in combination, may be referred to as slim spacers about the gate of the transistor as described above.

For reasons that will become more apparent, the extension spacers 170 (also referred to as "first and second extension spacers") are formed adjacent the dielectric liners 150 and extend laterally beyond the dielectric liners 150 and the spacers 160 along the silicon-on-insulator substrate. The dielectric liners 150 and extension spacers 170 are typically one or more layers of an oxide formed by any oxidation process such as wet or dry thermal oxidation in an ambient environment including an oxide, water, nitric oxide, or a combination thereof, or by chemical vapor deposition techniques using tetraethyl orthosilicate and oxygen as a precursor. In an exemplary embodiment, the dielectric liners 150 have a width of about 50 angstroms to about 400 angstroms, but more preferably about 150 angstroms. The extension spacers 170, in an exemplary embodiment, are about 10 angstroms to about 150 angstroms in thickness, but more preferably about 30 angstroms to about 100 angstroms, and have a width of about 50 angstroms to about 400 angstroms.

The spacers 160, which form a spacer for another ion implant, typically include silicon nitride, silicon oxynitride, or a combination thereof. In an exemplary embodiment, the spacers 160 are formed from a layer including silicon nitride that has been formed using chemical vapor deposition techniques using silane and ammonia as precursor gases. A ratio of a width of the spacers 160 to a thickness of the dielectric liners 150 is less than five, and more preferably, less than three.

The spacers 160 may be patterned by performing an isotropic or anisotropic etch process. When employing an isotropic etch process, a solution of phosphoric acid may be used with the dielectric liners 150 acting as an etching stop. Inasmuch as a thickness of the spacers 160 is greater in the regions adjacent the gate electrode 135, the isotropic etch removes the silicon nitride (which may form the spacers 160) on the top of the gate electrode 135 and the areas of silicon-on-insulator substrate not immediately adjacent the gate electrode 135, leaving tapered spacers 160. A width of the spacers 160 varies as the gate length of the transistor. In an exemplary embodiment, a ratio of the width of the spacers 160 to the length of the gate electrode 135 is about 0.8 to about 1.5.

The dielectric liner 150 may be patterned, for example, by performing an isotropic wet etch process using a solution of hydrofluoric acid. Another etchant that may be used is a mixture of concentrated sulphuric acid and hydrogen peroxide, commonly referred to as a piranha solution. A phosphoric acid solution of phosphoric acid and water may also be used to pattern the dielectric liner 150. The extension spacers 170 may be patterned, for example, by performing another isotropic wet etch process using a solution of hydrofluoric acid. Another etchant that may be used is a mixture of concentrated ammonia hydroxide to pattern the extension spacers 170.

It should noted that the width of the spacers, in general, may vary with the type of semiconductor device. For example, it has been found that input/output devices may benefit from larger spacers due to the amount of current the input/output device is expected to handle. PMOS devices may also benefit from larger spacers and, in particular, it has been found that larger spacers for the PMOS devices help reduce tensile stress thereon. In such a case, the spacers are designed to be about ten percent larger. To fabricate spacers of varying widths, it may be necessary to incorporate additional masking, deposition, and etching steps.

Figure 4:
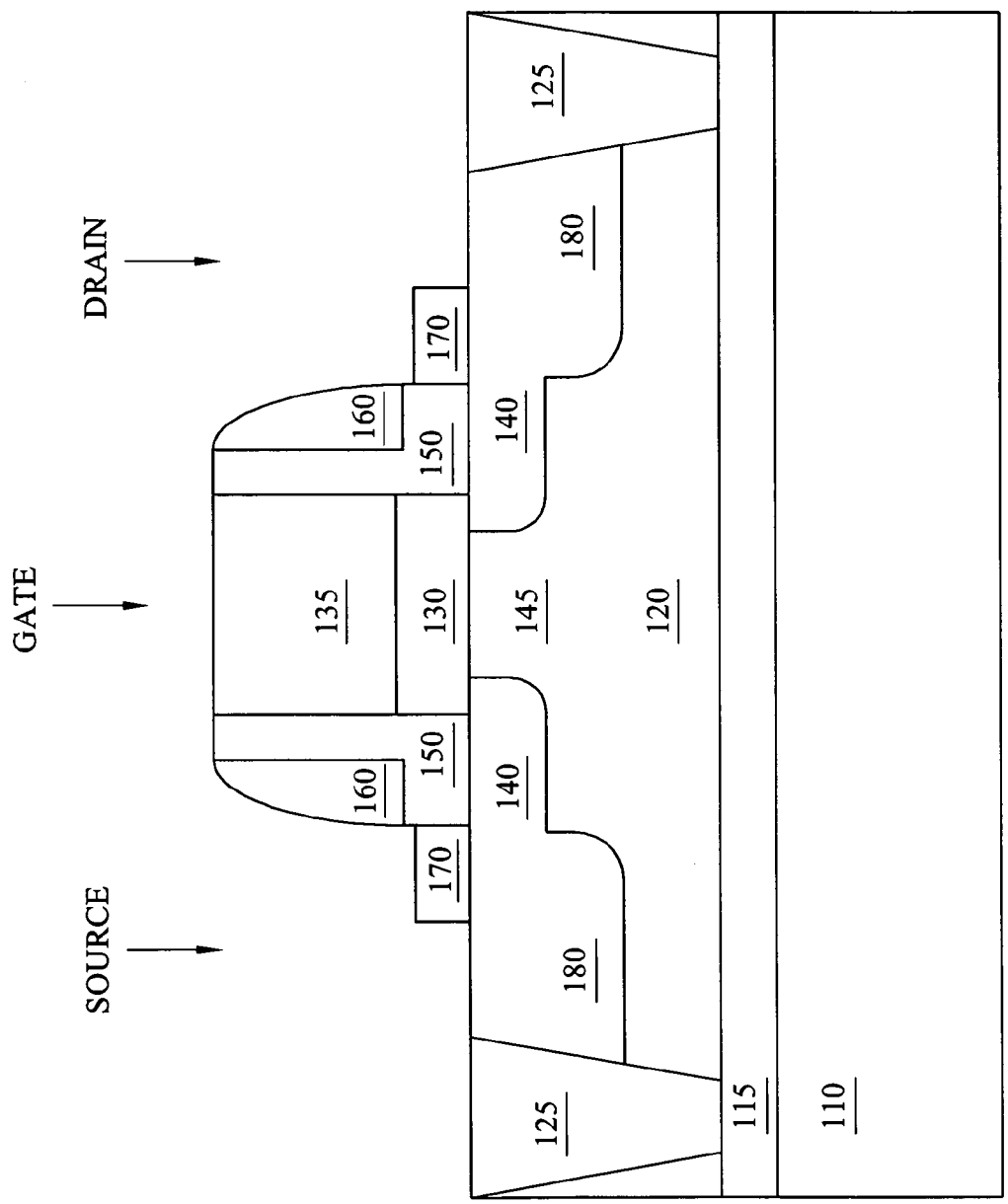

Turning now to FIG. 4, illustrated is a cross sectional view of an embodiment of forming source/drain regions 180 for the source and drain of the transistor according to the principles of the present invention. An ion implantation and rapid thermal anneal process in excess of 1000 degrees Centigrade is performed to create the source/drain regions 180 (again, albeit shallow junctions) below an upper surface of the silicon-on-insulator substrate and within the overlying layer of silicon 120. Typically, to dope the source/drain regions 180 of the transistor, boron ions (or other P-type dopants) for a PMOS device or arsenic ions (or other N-type dopants) for a NMOS device are implanted into the overlying layer of silicon 120 and the gate and spacers 160 serve as a mask. The ion implantation process may be performed at an energy level of about 5 to 40 keV and at a dose of $1 \times 10^{13}$ to $5 \times 10^{15}$ atoms/cm$^2$. An exemplary depth of the source/drain regions 180 is about 200 angstroms. In accordance with the orientation of the transistor as described herein, the source/drain regions 180 may have a surface orientation of (100). Furthermore, additional ion implants may be performed to create differing graded junction configurations.

Consequently, the transistor accommodates the advantages associated with shallow junctions in the silicon-on-insulator substrate associated with a source and drain thereof. As illustrated, the lightly doped drains 140 extend under the dielectric liners 150, spacers 160 and extension spacers 170 and form an electrical connection between the source and drain, and the channel region 145 underlying the gate of the transistor. The source/drain regions 180 are formed adjacent the lightly doped drains 140 and the channel region 145. Thus, the source and drain of the transistor are located below an upper surface of the silicon-on-insulator substrate (extending under the dielectric liners 150 and the extension spacers 170) and adjacent the channel region 145 under the gate. A depth of the junction, however, is quite shallow thereby preserving the benefits associated with transistors exhibiting shallow junctions and, in particular, reduced short channel effect and "off" current or leakage without compromising the "on" current of the transistor.

Figure 5:
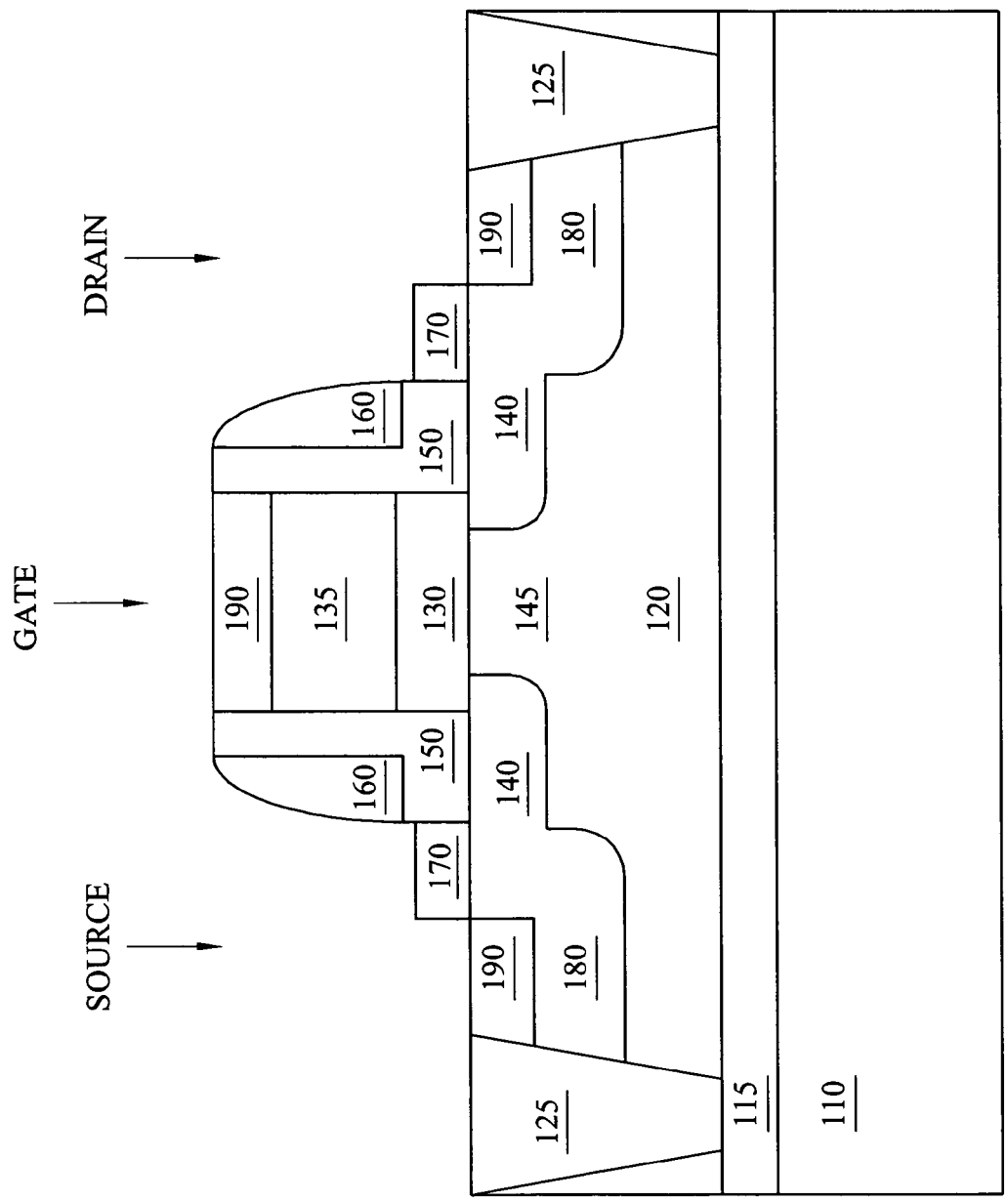

Turning now to FIG. 5, illustrated is a cross sectional view of an embodiment of forming silicide regions 190 for the transistor according to the principles of the present invention. Generally, a silicidation process involves depositing a metal layer such as nickel, cobalt, palladium, platinum, copper, molybdenum, titanium, tantalum, tungsten, erbium, zirconium, a combination thereof, or the like, and causing the metal layer to react with silicon, thereby creating a silicide. In an exemplary embodiment, the silicidation process utilizes a metal comprising nickel, cobalt, platinum, palladium, a combination thereof, or the like. The metal layer may be formed by conventional deposition techniques such as evaporation, sputter deposition, chemical vapor deposition, or the like.

Prior to depositing the metal layer, it is preferred to clean the wafer to remove native oxide. The cleaning solutions that may be used include hydrofluoric acid, sulphuric acid, hydrogen peroxide, ammonia hydroxide solution, a combination thereof, or the like. The silicidation process may be performed by annealing causing the metal layer to selectively react with exposed silicon regions (e.g., the source/drain regions 180) and the polysilicon regions (e.g., the gate electrodes 135) to form a silicide. In an advantageous embodiment in which the metal layer comprises nickel, platinum, palladium, or cobalt, the silicidation process forms nickel silicide, platinum silicide, palladium silicide, or cobalt silicide, respectively. The excess material of the metal layer may be removed, for example, by performing a wet dip in a solution of sulfuric acid, hydrogen peroxide, ammonia hydroxide, or the like.

As illustrated, the silicide regions 190, located over a portion of the source/drain regions 180 (also referred to as "first and second silicide regions" over a portion of the source and drain, respectively), extend laterally beyond the dielectric liner 150 and extension spacer 170 along the silicon-on-insulator substrate away from the gate. Thus, the extension spacers 170 are interposed between the dielectric liners 150 and the silicide regions 190 located over a portion of the source/drain regions 180. A length of the channel region 145 of the transistor is reduced inasmuch as a width of the dielectric liners 150 and spacers 160 about the gate is relatively thin. The transistor according to the present invention can, therefore, take advantage of the benefits of incorporating a channel region 145 having a shorter length. Additionally, the extension spacers 170 control a distance between the channel region 145 and the silicide regions 190 to reduce the possibility of silicide spikes as described above. In accordance therewith, the transistor benefits from, among other things, an enhanced strain effect (associated with contact etching stop layer as hereinafter described) within the channel region 145 thereof and a width of the extension spacers 170 can be modulated as necessary to reduce the deleterious effects of, for instance, silicide spikes within the transistor.

In an alternative embodiment, after the silicide regions 190 are formed over portions of the source/drain regions 180, the extension spacers 170 may be removed, or substantial portions thereof, from the transistor. Inasmuch as the extension spacers 170 have defined and maintained a distance between the channel region 145 and the silicide regions 190, it may not be necessary for the extension spacers 170 to remain thereafter. In such instances, the extension spacers 170 may be removed, for example, by performing an isotropic wet etch process using a solution of hydrofluoric acid. Another etchant that may be used is a mixture of concentrated sulphuric acid and hydrogen peroxide, commonly referred to as a piranha solution. A phosphoric acid solution of phosphoric acid and water may also be used to remove the extension spacers 170.

Figure 6:
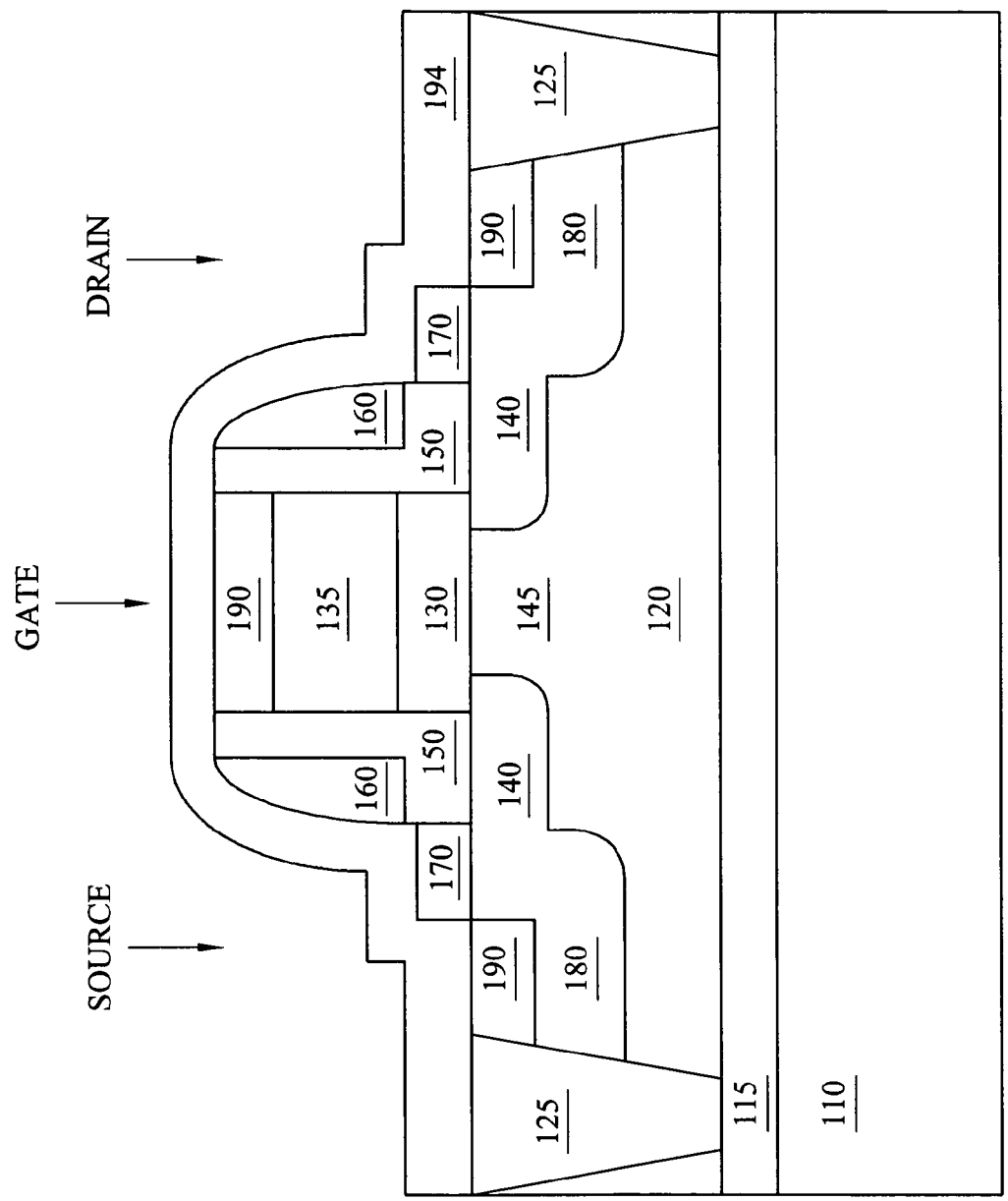

Turning now to FIG. 6, illustrated is a cross sectional view of forming a contact etching stop layer 194 over the transistor in accordance with the principles of the present invention. The contact etching stop layer 194 (typically embodied in a high stress film) is formed over portions of the transistor to create a tensile stress along the <100> direction. The contact etching stop layer 194 may be silicon nitride or any other tensile stress material and may be formed by a chemical vapor deposition process. The chemical vapor deposition process can be a low pressure chemical vapor deposition process, a rapid thermal chemical vapor deposition process, atomic layer chemical vapor deposition process or a plasma enhanced chemical vapor deposition process, as commonly known and used in the art.

In an advantageous embodiment, contact etching stop layer 194 exerts a tensile stress in the range of about 50 mega Pascals to about 2.0 giga Pascals along the source-to-drain direction. A thickness of the contact etching stop layer 194 is about 300 angstroms to about 1000 angstroms. In one embodiment, the contact etching stop layer 194 may include silicon nitride deposited by low pressure chemical vapor deposition process having a magnitude of about 1.2 giga Pascals and, in another embodiment, the contact etching stop layer 194 may include silicon nitride deposited by a plasma enhanced chemical vapor deposition process having a magnitude of about 0.7 giga Pascals.

The contact etching stop layer 194 for PMOS devices may be a compressive stress film or a no stress film, while the contact etching stop layer 194 for NMOS devices may be a tensile stress film. The compressive stress film results in a compressive strain in the channel region of the PMOS devices in the source-to-drain direction to enhance hole mobility. In general, the contact etching stop layer 194 exerts significant influence on the channel region 145, modifying a silicon lattice spacing in the channel region 145, and thus introducing strain therein. The resulting strain effect introduced into the channel region 145 of the transistor improves carrier mobility to enhance a performance of the transistor.

Figure 7:
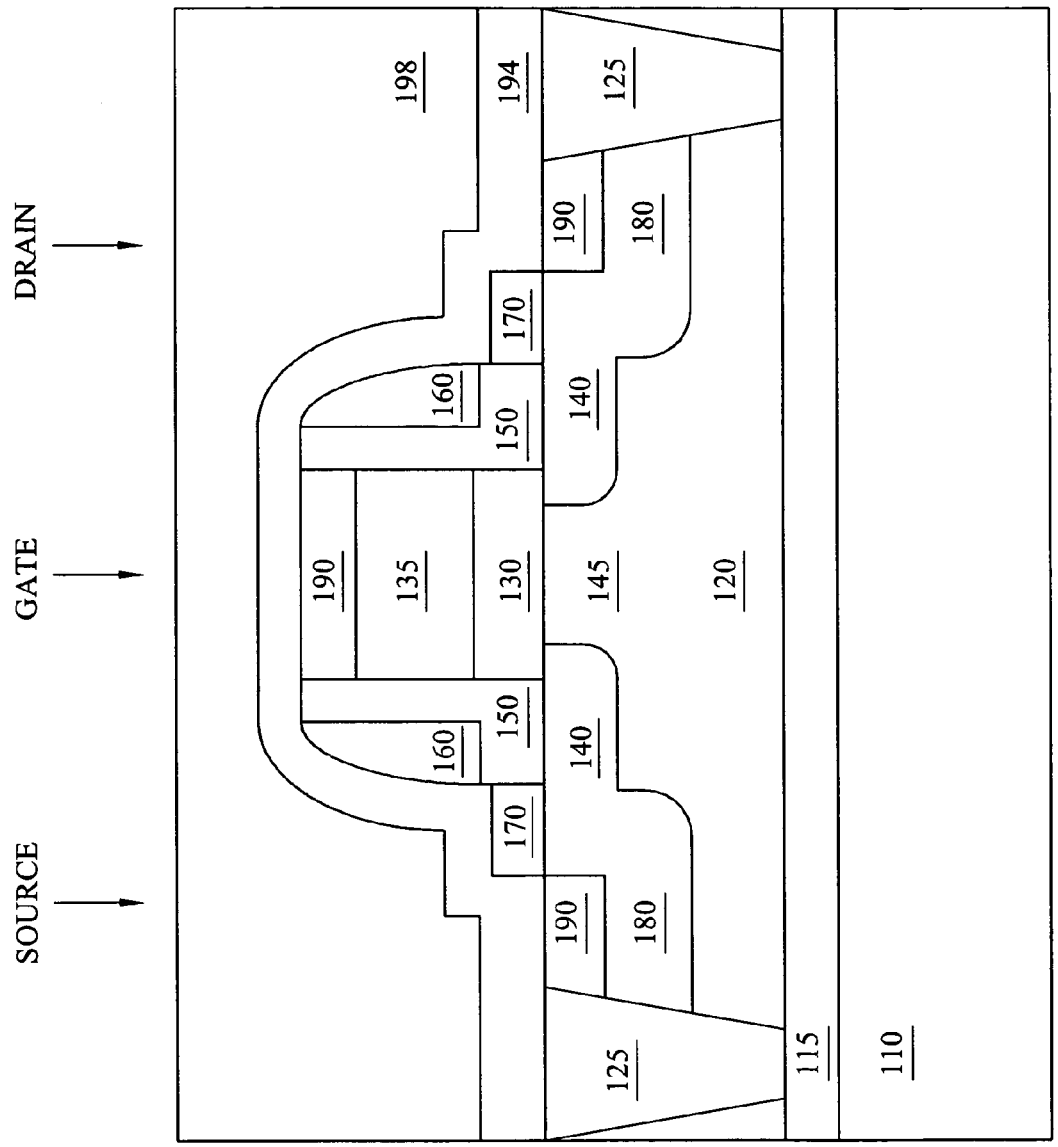

Turning now to FIG. 7, illustrated is a cross sectional view of an inter-layer dielectric layer 198 in accordance with the principles of the present invention. The inter-layer dielectric layer 198 is formed over the contact etching stop layer 194. The inter-layer dielectric layer 198 typically has a planarized surface and may include silicon oxide formed by deposition techniques such as chemical vapor deposition. The inter-layer dielectric layer 198 may be about 1500 angstroms to about 8000 angstroms in thickness, but more preferably about 3000 angstroms to about 4000 angstroms. Furthermore, in one advantageous embodiment, the inter-layer dielectric layer 198 exerts a tensile stress along the <100> direction with a magnitude of about 0.1 giga Pascals to about 2.0 giga Pascals. Thereafter, standard processing techniques may be used to complete fabrication of the transistor including process steps such as forming metal lines and layers, forming vias and plugs, packaging, and the like.

Thus, a semiconductor device and method of forming the same with readily attainable and quantifiable advantages has been introduced. Those skilled in the art should understand that the previously described embodiments of the semiconductor device and related method of forming the same are submitted for illustrative purposes only and that other embodiments capable of providing a semiconductor device employing slim spacers with an extension spacer are well within the broad scope of the present invention.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device formed on a semiconductor substrate, comprising:
   a gate over said semiconductor substrate;
   a dielectric liner on a sidewall of said gate;
   a dielectric spacer on a horizontal leg of said dielectric liner, wherein said dielectric spacer is formed of a dielectric material and has an outer edge substantially aligned with an outer edge of said dielectric liner;

an extension spacer adjacent and extending laterally beyond said outer edge of said dielectric spacer along said semiconductor substrate;

a source/drain located below an upper surface of said semiconductor substrate and adjacent a channel region under said gate; and a silicide region over a portion of said source/drain, said silicide region having an inner edge substantially aligned with an outer edge of said extension spacer.

2. The semiconductor device as recited in claim 1 wherein said semiconductor substrate is a silicon-on-insulator substrate including an underlying substrate, a buried insulating layer and an overlying layer of silicon.

3. The semiconductor device as recited in claim 2 wherein shallow trench isolation regions are formed over said buried insulating layer.

4. The semiconductor device as recited in claim 1 wherein said gate includes a gate dielectric layer and a gate electrode.

5. The semiconductor device as recited in claim 1 wherein said source/drain, includes:

a lightly doped drain located below said upper surface of said semiconductor substrate and adjacent said channel region under said gate, said lightly doped drain extending under said dielectric liner and said extension spacer, and a source/drain region located below said upper surface of said semiconductor substrate and adjacent said lightly doped drain.

6. The semiconductor device as recited in claim 1 further comprising a contact etching stop layer located over portions of said semiconductor device.

7. The semiconductor device as recited in claim 6 further comprising an inter-layer dielectric layer formed over said contact etching stop layer.

8. The semiconductor device as recited in claim 1 wherein said extension spacer is about 30 angstroms to about 100 angstroms in thickness.

9. The semiconductor device as recited in claim 1 wherein said dielectric liner has a first thickness, and wherein said extension spacer has a second thickness different from said first thickness.

10. The semiconductor device as recited in claim 1, wherein a bottom portion of said extension spacer comprises different materials from said dielectric liner.

11. The semiconductor device as recited in claim 1, wherein a bottom portion of said extension spacer contacts said semiconductor substrate, and wherein atop portion of said extension spacer and said bottom portion of said extension spacer comprise a same material.

12. A method of forming a semiconductor device on a semiconductor substrate, comprising:

forming a gate over said semiconductor substrate;

forming a dielectric liner having a first thickness on a sidewall of said gate;

forming a dielectric spacer on a horizontal leg of said dielectric liner, wherein said dielectric spacer has an outer edge substantially aligned with an outer edge of said dielectric liner;

forming an extension spacer having a second thickness different from the first thickness adjacent and extending laterally beyond said dielectric liner along said semiconductor substrate;

forming a source/drain below an upper surface of said semiconductor substrate and adjacent a channel region under said gate; and forming a silicide region over a portion of said source/drain and extending laterally beyond said extension spacer along said semiconductor substrate.

13. The method as recited in claim 12 wherein said semiconductor substrate is a silicon-on-insulator substrate including an overlying layer of silicon formed over a buried insulating layer formed over an underlying substrate.

14. The method as recited in claim 13 further comprising forming shallow trench isolation regions over said buried insulating layer.

15. The method as recited in claim 12 wherein forming said gate includes forming a gate dielectric layer over said semiconductor substrate and forming a gate electrode over said gate dielectric layer.

16. The method as recited in claim 12 wherein forming said source/drain, includes:

forming a lightly doped drain below said upper surface of said semiconductor substrate and adjacent said channel region under said gate, said lightly doped drain extending under said dielectric liner and said extension spacer, and forming a source/drain region below said upper surface of said semiconductor substrate and adjacent said lightly doped drain.

17. The method as recited in claim 12 further comprising forming a contact etching stop layer over portions of said semiconductor device and an inter-layer dielectric layer over said contact etching stop layer.

18. The method as recited in claim 12 further comprising substantially removing said extension spacer after forming said silicide region.

19. The method as recited in claim 12 wherein said extension spacer is about 30 angstroms to about 100 angstroms in thickness.

20. The method as recited in claim 12 wherein said step of forming said extension spacer comprises isotropic wet etching.

21. The method as recited in claim 12, wherein after the step of forming said extension spacer, a bottom portion of said extension spacer comprises different material from said dielectric liner.

22. The method as recited in claim 12, wherein after the step of forming said extension spacer, a bottom portion of said extension spacer contacts said semiconductor substrate, and wherein a top portion of said extension spacer and said bottom portion of said extension spacer comprise a same material.

23. A transistor formed on a semiconductor substrate, comprising:

a gate over said semiconductor substrate;

first and second dielectric liners having a first thickness on opposing sidewalls of said gate;

a first dielectric spacer on a horizontal leg of said first dielectric liner, wherein an outer edge of said first spacer and an outer edge of said first dielectric liner are substantially aligned;

a second dielectric spacer on a horizontal leg of said second dielectric liner, wherein an outer edge of said second dielectric spacer and an outer edge of said second dielectric liner are substantially aligned;

first and second extension spacers havint a second thickness different from the first thickness adjacent and extending laterally beyond said first and second dielectric liners, respectively, along said semiconductor substrate;

a source located below an upper surface of said semiconductor substrate and adjacent a channel region under said gate;

a drain located below an upper surface of said semiconductor substrate and adjacent said channel region under said gate; and first and second silicide regions over a portion of said source and drain, respectively, said first and second silicide regions having inner edges substantially aligned with the respective outer edges of the respective first and second extension spacers.

24. The transistor as recited in claim 23 wherein said semiconductor substrate is a silicon-on-insulator substrate including an underlying substrate, a buried insulating layer and an overlying layer of silicon.

25. The transistor as recited in claim 24 wherein shallow trench isolation regions are formed over said buried insulating layer.

26. The transistor as recited in claim 23 wherein said gate includes a gate dielectric layer and a gate electrode.

27. The transistor as recited in claim 23 wherein said source, includes:

a lightly doped source located below said upper surface of said semiconductor substrate and adjacent said channel region under said gate, said lightly doped drain extending under said first dielectric liner and said first extension spacer, and a source/drain region located below said upper surface of said semiconductor substrate and adjacent said lightly doped drain.

28. The transistor as recited in claim 23 wherein said drain, includes:

a lightly doped drain located below said upper surface of said semiconductor substrate and adjacent said channel region under said gate, said lightly doped drain extending under said second dielectric liner and said second extension spacer, and a source/drain region located below said upper surface of said semiconductor substrate and adjacent said lightly doped drain.

29. The transistor as recited in claim 23 further comprising a contact etching stop layer located over portions of said transistor.

30. The transistor as recited in claim 29 further comprising an inter-layer dielectric layer formed over said contact etching stop layer.

31. The transistor as recited in claim 23 wherein said extension spacer is about 30 angstroms to about 100 angstroms in thickness.

32. The transistor as recited in claim 23, wherein bottom portions of said first and second extension spacers comprise different materials from said first and said second dielectric liners.

33. The transistor as recited in claim 23, wherein bottom portions of said first and second extension spacers contact said semiconductor substrate, and wherein a top portion of said first extension spacer and said bottom portion of said first extension spacer comprise a same material, and wherein a top portion of said second extension spacer and said bottom portion of said second extension spacer comprise a same material.

* * * * *

UNITED STATES PATENT AND TRADEMARK OFFICE
CERTIFICATE OF CORRECTION

PATENT NO. : 7,265,425 B2 Page 1 of 1
APPLICATION NO. : 10/989073
DATED : September 4, 2007
INVENTOR(S) : Chen et al.

It is certified that error appears in the above-identified patent and that said Letters Patent is hereby corrected as shown below:

In Col. 11, line 49, delete "atop" and insert --a top--.
In Col. 12, line 56, insert --dielectric-- after "first".
In Col. 13, line 30, delete "drain" and insert --source--.

Signed and Sealed this

Twenty-seventh Day of November, 2007

JON W. DUDAS
*Director of the United States Patent and Trademark Office*